United States Patent [19]

Muka

[11] Patent Number: 4,481,406
[45] Date of Patent: Nov. 6, 1984

[54] HEATER ASSEMBLY FOR THERMAL PROCESSING OF A SEMICONDUCTOR WAFER IN A VACUUM CHAMBER

[75] Inventor: Richard S. Muka, Topsfield, Mass.
[73] Assignee: Varian Associates, Inc., Palo Alto, Calif.
[21] Appl. No.: 459,745
[22] Filed: Jan. 21, 1983
[51] Int. Cl.³ .................................................. H05B 3/22
[52] U.S. Cl. .................................. 219/411; 219/343; 219/390; 219/405; 219/354
[58] Field of Search ............. 219/411, 354, 405, 343, 219/390, 388, 407; 432/148

[56] References Cited

U.S. PATENT DOCUMENTS

| | | | |
|---|---|---|---|
| 2,571,218 | 10/1951 | Buttero | 219/405 |
| 3,059,087 | 10/1952 | Perlman | 219/405 |
| 3,155,814 | 11/1964 | Appleman | 219/407 |
| 3,170,060 | 2/1965 | Oliver | 219/407 |
| 3,573,429 | 4/1971 | Bradbeck | 219/343 |
| 3,623,712 | 11/1971 | McNeilly | 219/343 |
| 3,901,183 | 8/1975 | Wittkower | 118/49.1 |
| 3,930,488 | 1/1976 | Wallis | 219/405 |
| 3,954,191 | 5/1976 | Wittkower et al. | 214/17 B |
| 4,041,278 | 8/1977 | Boah | 219/354 |
| 4,097,226 | 6/1978 | Erikson et al. | 219/405 |
| 4,101,759 | 7/1978 | Anthony | 219/354 |
| 4,350,537 | 9/1982 | Young et al. | 148/1.5 |
| 4,417,347 | 11/1983 | Muka et al. | 373/158 |

Primary Examiner—C. L. Albritton
Assistant Examiner—Teresa J. Walberg
Attorney, Agent, or Firm—Stanley Z. Cole; William R. McClellan

[57] ABSTRACT

A heater assembly for annealing a semiconductor wafer in a vacuum chamber includes a blackbody source having a constant planar energy flux characteristic and a wafer support for supporting the wafer adjacent to, but not spaced apart from, the source in planar parallel alignment therewith. The heater assembly further includes radiation shields and a housing providing support for the source, the wafer support and the radiation shields in fixed relationship. The housing includes a heat sink for removal of thermal energy and a slot for insertion and removal of the wafer. The heater assembly confines thermal energy and reduces input energy requirements. In addition, the requirement for a movable shutter is eliminated.

6 Claims, 6 Drawing Figures

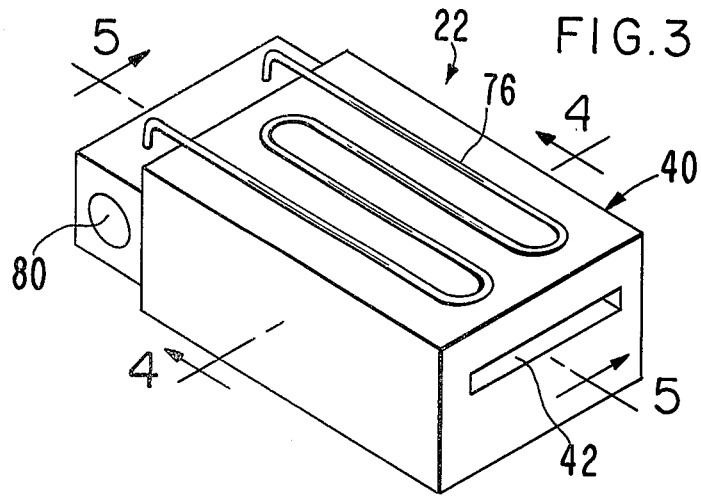
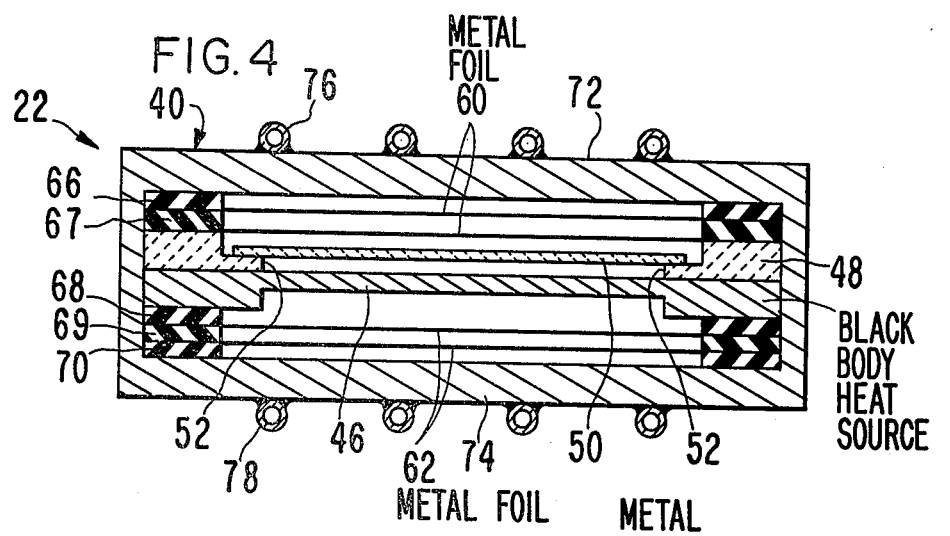
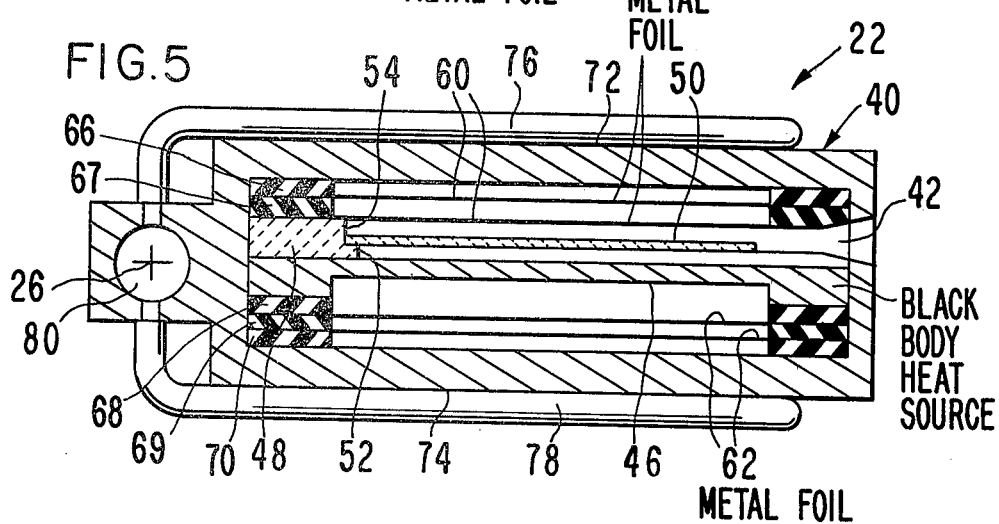

HEATER ASSEMBLY FOR THERMAL PROCESSING OF A SEMICONDUCTOR WAFER IN A VACUUM CHAMBER

BACKGROUND OF THE INVENTION

This invention relates to apparatus for thermal processing of semiconductor wafers and, more particularly, to a novel heater assembly employing a blackbody radiation source with a constant planar energy flux for thermal treatment of semiconductor wafers in vacuum.

In the semiconductor industry, semiconductor wafers are frequently subjected to thermal treatment as a part of the process of fabricating both discrete devices and integrated circuits. In the course of processing, the crystalline lattice of the semiconductor material, typically silicon, may be damaged. For example, during ion implantation, the incident energetic ions will break covalent bonds between silicon atoms in the crystalline lattice. The defects in the crystalline lattice are eliminated by thermal treatment, or annealing, of the wafers at a sufficiently high temperature for a sufficiently long time. The thermal treatment that produces annealing of crystal damage also serves to activate the dopant species in the silicon; i.e., the dopant atoms such as boron, phosphorous or arsenic assume substitutional or near-substitutional positions in the crystalline lattice so they may serve as sources of charged carriers.

In the production of thin films of semiconductor materials, it is desirable to increase the grain size of polycrystalline material or to convert amorphous silicon into an epitaxial silicon layer. The application of thermal energy in an appropriate manner may be used to accomplish these objectives.

Phosphosilicate glass (PSG) has been widely used as an insulating layer between conductive elements and as a passivating layer in semiconductor devices. Chemical vapor deposited PSG is relatively nonuniform over the surface area of the device and exhibits poor step coverage. Therefore, PSG layers have been thermally treated to produce plastic flow and result in uniform thickness and tapered step coverage. Pending application Ser. No. 412,455, filed Aug. 27, 1982, and assigned to the assignee of the present application, discloses a method for thermal treatment of PSG layers.

The conventional technique for thermally treating semiconductor materials is furnace annealing. The wafers are treated in the furnace at temperatures of about 900° C. to 1100° C. for times on the order of one-half hour. Annealing under such conditions is generally satisfactory, especially for lower dose implants on the order of $10^{10}$ to $10^{14}$ per $cm^2$. Activation is virtually always satisfactory for such implants. However, uniformity of dopant distribution is often not obtained, since the time and temperature characteristics are not identical for all wafers in a batch. Also, the annealing of wafers at such temperatures for significant lengths of time produces undesirable spreading or redistribution of the dopant, both laterally and vertically. This is especially undesirable for high dose implants on the order of $10^{15}$ to $2 \times 10^{16}$ per $cm^2$, such as are used in fabricating high density MOS devices. Spreading also makes shallow junction and/or VLSI devices difficult if not impossible to fabricate. Conventional furnace annealing is time-consuming and is not particularly energy efficient.

Various techniques have been proposed for producing the rapid thermal treatment of semiconductor materials. It has been found that fast annealing is possible with laser beams and electron beams. However, both require mechanical, electro-optical or electromechanical beam scanning means. In addition, laser beams are highly inefficient and, because of the extremely rapid heating of the wafer, can cause cracking or peeling of oxide layers. Electron beams are relatively energy efficient, but produce neutral traps near insulator-semiconductor junctions which can result in charging effects in operating devices over time. Flash lamps and arc lamps have also been used to thermally treat semiconductor materials. This approach has the advantage that it heats the whole wafer at the same time and eliminates thermal nonuniformities. However, the process is not energy efficient and may require complex optical elements.

A thermal processing system employing a blackbody radiator having a constant planar energy flux characteristic is disclosed in pending application Ser. No. 262,838, filed May 12, 1981, and assigned to the assignee of the present application. A semiconductor wafer is positioned on a platen which is then rotated into parallel alignment with a fixed position blackbody source. Between processing of successive wafers, a shutter is moved in front of the blackbody source to contain radiant energy. The system is capable of annealing crystal damage in semiconductor wafers and of activating impurity dopants in the silicon in times on the order of ten seconds.

The above-described isothermal annealing system has provided highly satisfactory performance and energy efficiency. However, it is desired to further improve the energy efficiency as much as possible. Due to the movement of the platen and wafer relative to the blackbody source, the relative positions of these elements will be subject to certain tolerances and variations. Furthermore, a non-negligible portion of the energy from the blackbody source radiates to the walls of the vacuum chamber and causes heating thereof. Excessive heating of O-rings used to seal the processing chamber can cause reliability problems.

It is an object of the present invention to provide apparatus for energy efficient thermal processing of a semiconductor wafer.

It is another object of the present invention to provide mechanically stable positioning of a semiconductor wafer relative to a thermal source during thermal processing.

It is still another object of the present invention to provide a heater assembly for thermal processing of a semiconductor wafer in a vacuum chamber, wherein the thermal energy is substantially confined to the wafer processing region without requiring a movable shutter.

SUMMARY OF THE INVENTION

According to the present invention, these and other objects and advantages are achieved in a heater assembly for thermal processing of a semiconductor wafer in a vacuum chamber. The heater assembly comprises a blackbody source having a constant planar energy flux characteristic and wafer support means for supporting the wafer in a wafer-processing position adjacent to but spaced apart from the blackbody source in substantially planar parallel alignment therewith. The heater assembly further comprises radiation shield means positioned on opposite sides of the blackbody source and a housing providing support for the source, the wafer support means and the radiation shield means in a fixed relationship. The housing includes heat sink means for removal of thermal energy generated by the source. The heater assembly includes a slot for insertion and removal of said wafer to and from the wafer-processing position.

Thermal processing apparatus in accordance with the present invention comprises a processing chamber, means for controlling the pressure in the processing chamber, wafer handling means for introducing and removing the semiconductor wafer from the processing chamber and the heater assembly, as described above, positioned in the processing chamber. During operation, the pressure in the chamber is reduced. Wafers are introduced into the heater assembly by the wafer handling means, thermally processed and then ejected from the heater assembly to the wafer handling means.

BRIEF DESCRIPTION OF THE DRAWINGS

For a more complete understanding of the present invention, reference may be had to the accompanying drawings which are incorporated herein by reference and in which:

FIG. 3 is a perspective view of a heater assembly in accordance with the present invention;

FIG. 4 is a cross-sectional view of the heater assembly of FIG. 3 taken through the line 4—4;

FIG. 5 is a cross-sectional view of the heater assembly of FIG. 3 taken through the line 5—5.

DETAILED DESCRIPTION OF THE INVENTION

Figure 1:
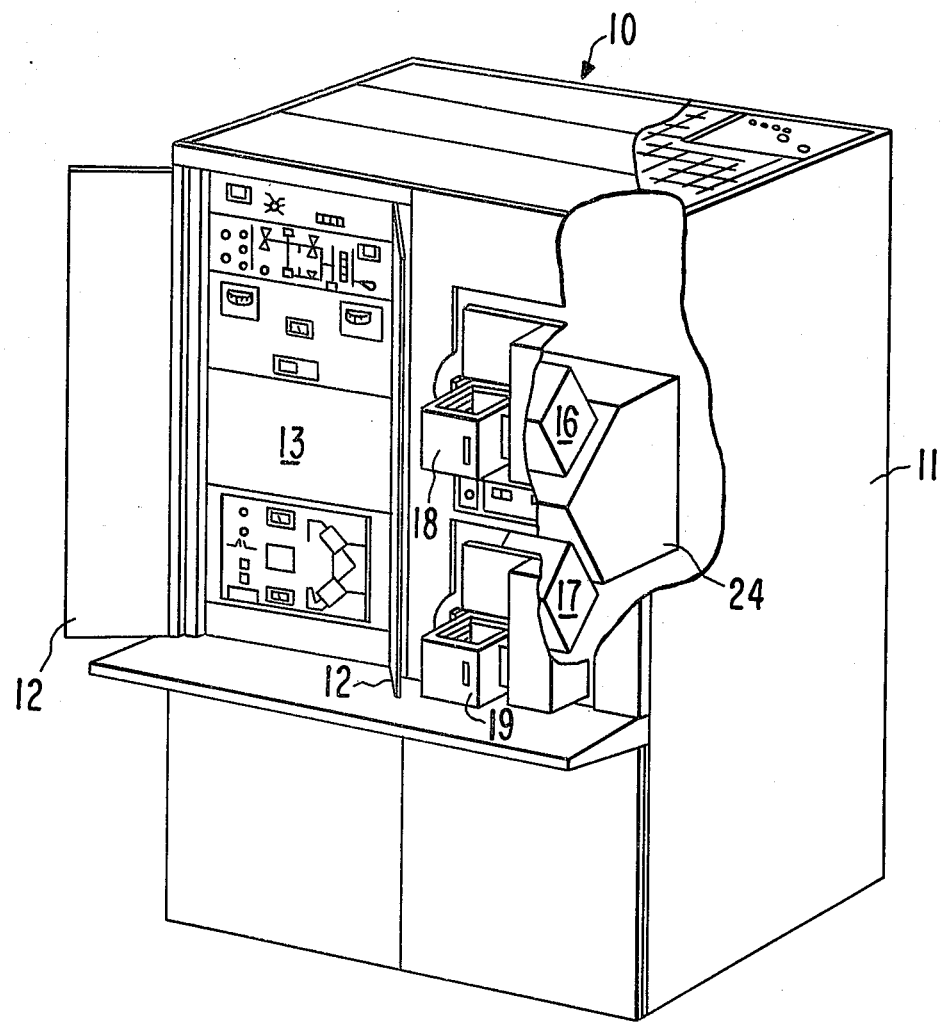
FIG. 1 is a perspective, partially broken away view of processor apparatus in accordance with the present invention.
Figure 2:
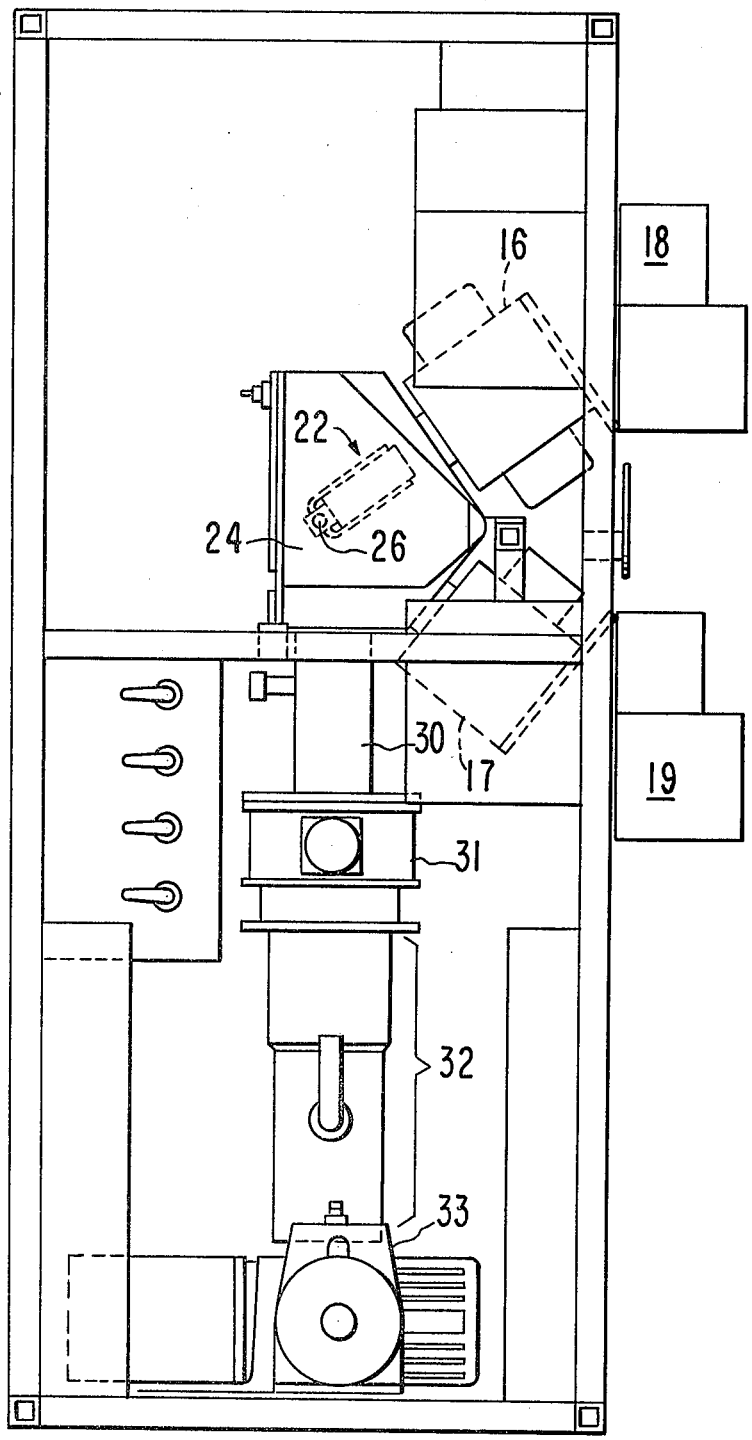
FIG. 2 is a side view of the apparatus of FIG. 1.

Processor apparatus for thermal treatment of semiconductor wafers, in accordance with the present invention, is illustrated in FIGS. 1 and 2. The processor is configured to receive, thermally treat and discharge semiconductor wafers. The processor apparatus 10 is shown in FIG. 1 in partially broken away, perspective view. Electronic control panels 13 are included within housing 11 and are accessible through doors 12. The apparatus utilizes a Wayflow TM gravity in, gravity out end station, as described in U.S. Pat. No. 3,901,183, issued Aug. 26, 1975, to Wittkower for insertion and removal of silicon wafers. In the Wayflow TM end station, a wafer is inserted from a cassette wafer carrier placed in a cassette holder 18 through an entrance lock 16 (see U.S. Pat. No. 3,954,191, issued May 4, 1976, to Wittkower et al.) into a vacuum processing chamber 24. The wafer slides by gravity feed into a heater assembly 22 (FIG. 2) which is oriented in alignment with the entrance lock 16 in an appropriate receiving position. After insertion of the wafer, a heater within the heater assembly 22 is energized to provide the thermal treatment of the wafer. The construction and operation of the heater assembly 22 is described in detail hereinafter. After thermal treatment is completed, the heater assembly 22 is rotated downwardly about an axis 26 into alignment with an exit lock 17. Through the operation of gravity, the wafer passes from the heater assembly 22 through the exit lock 17 into a cassette in a cassette holder 19.

To promote uniform heating, it is desired to heat by radiation and not by convection. Control is maintained over the pressure, at least in the region of the heater assembly 22. The pressure in this region varies from $10^{-7}$ Torr to ambient and is selected so that the mean free path of the gas molecules is much greater than the source to wafer distance. Significant conduction heating is thereby eliminated. As seen in FIG. 2, a mechanical roughing pump 33 is used in series with a diffusion pump 32 to evacuate the chamber 24 through a tube 30 and a baffle 31. Thus, the pressure in the processing chamber 24 is controlled at the desired level in accordance with the criterion stated above. Consequently, radiative heating by the thermal source predominates. Typically, the pressure in the processing chamber is maintained during thermal processing between $10^{-5}$ and $10^{-6}$ Torr.

The construction of the heater assembly 22 is shown in FIGS. 3-5. A housing 40 includes a slot 42 for insertion and removal of a semiconductor wafer. When a wafer is inserted through the slot 42, it is substantially enclosed by the heater assembly 22. The internal structure of the heater assembly 22 is best illustrated in FIGS. 4 and 5. A blackbody radiation source 46, having a constant planar energy flux characteristic, is mounted in the central portion of the heater assembly 22. The blackbody source 46 is described in more detail hereinafter. A wafer support structure 48 is mounted adjacent to the blackbody source 46 and in alignment with the slot 42. When a wafer 50 is inserted through the slot 42 into the heater assembly 22, the support structure 48 supports the wafer 50 in substantially planar, parallel alignment with the source 46 and spaced therefrom, typically by approximately ⅛ inch. The wafer support structure 48 is formed of a nonconductive, refractory material such as a ceramic material and includes lips 52 which support the wafer 50 at its peripheral edge and a stop 54 against which the wafer 50 rests during processing. The wafer 50 is positioned with its surface, except for a small portion around the periphery, exposed directly to the source 46 and spaced uniformly therefrom. During processing, the heater assembly 22 is oriented at an angle to vertical, as shown in FIG. 2, so that gravity urges the wafer 50 against the stop 54 and the lips 52.

The heater assembly 22 includes a pair of radiation shields 60 mounted above the wafer support structure 48 on the side of the wafer 50 opposite the source 46. The heater assembly 22 further includes a pair of radiation shields 62 mounted below the source 46 on the side of the source 46 opposite the wafer 50. The radiation shields 60, 62 are typically a metal foil such as tungsten, molybdemum or tantalum and can be spaced apart by about ⅛ inch. The radiation shields 60, 62 are mounted in substantially planar, parallel alignment with the source 46 and are appropriately spaced by insulators 66, 67, 68, 69 and 70 which extend around the outer periphery of each of the radiation shields 60, 62. In a preferred embodiment, the insulators and shields are stitched together with tungsten wire. The shields 60, 62 reduce thermal losses in accordance with the formula $1/n+1$, where n is the number of shields in succession providing there is a vacuum separation between each shield. It will be realized that more or fewer shields can be utilized depending on the desired level of thermal losses.

Except for the area of the slot 42, the housing 40 surrounds the heater 46, the wafer 50 in the processing position and the radiation shields 60, 62. The housing 40 includes heat sink portions 72, 74 and is a thermally conductive material such as aluminum. Removal of heat from the assembly 22 is enhanced by circulation of coolant fluid through coolant tubes 76, 78 which are in thermal contact with the heat sink portions 72, 74, respectively. It will be realized by those skilled in the art that heat can be removed by other suitable heat sink configurations. Typically, the heat sink portions 72, 74 are in substantially planar, parallel alignment with the blackbody source 46 for most efficient heat removal.

The housing 40 includes a mounting hole 80 positioned at the opposite end of the housing 40 from the slot 42. During operation, the heater assembly 22 rotates about the axis 26 which extends through the mounting hole 80. Connections to the coolant tubes 76, 78 and electrical connections to the blackbody source 46 are made by means of rotary connections through the mounting hole 80.

Figure 6:
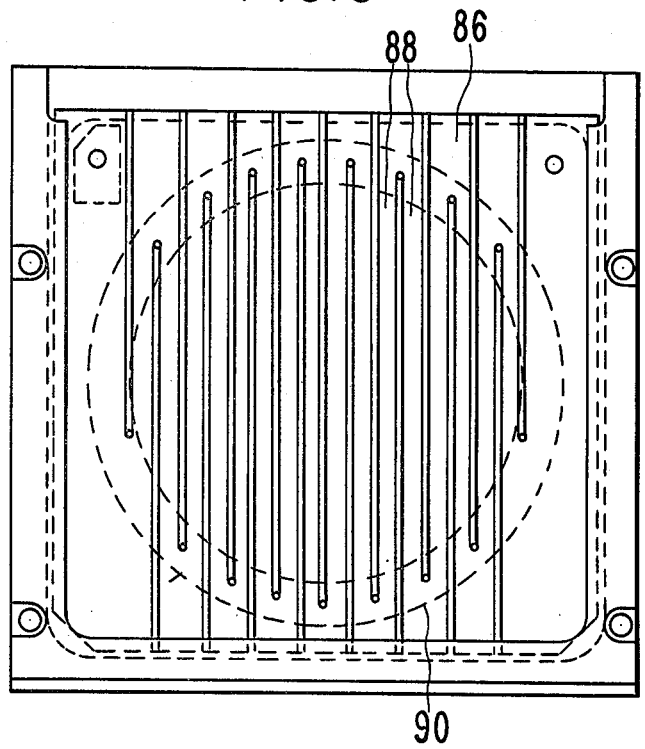
FIG. 6 is a frontal view of a blackbody radiator for incorporation into the heater assembly of FIGS. 3-5.

A preferred embodiment of the blackbody source 46 is shown in detail in FIG. 6. To obtain uniform heating over the area of the wafer, the blackbody source 46 describes a uniform thermal map over its surface. This uniform thermal map produces a planar thermal front; i.e., on parallel planes in front of the source, the same temperature is experienced. Thus, since heating of the wafer is radiative, the radiation heats the wafer with two dimensional isotropy. To produce the isotherms, a planar source is preferably, although not necessarily, used.

The blackbody source is a resistive material which can be molded or cut into a planar shape containing a pattern of strips. The most preferred source is graphite, one example of which is Stackpole 2020, which is available in sheet form and can be cut into the serpentine pattern shown in FIG. 6. Alternatively, high purity pyrolitic graphite may be used. A sheet 86 of graphite about 1/16 to ⅛ inch thick is configured to produce the serpentine pattern consisting of strips 88. In a preferred embodiment, the sheet 86 is counterbored before the strips 88 are cut out in order to reduce the sheet thickness within the circumference 90. As a consequence, the temperature is highest in the circular zone within the circumference 90, the zone that is placed in opposition to a wafer inserted into the heater assembly 22. For the most uniform heating, the effective area of the blackbody source 46 must be at least as large as the wafer being heated, and the wafer should be as close to the source 46 as practicable. It will be realized by those skilled in the art that other types of blackbody radiation source can produce a constant planar energy flux characteristic.

The heater assembly 22 shown in FIGS. 3–5 is adapted for gravity in, gravity out operation as described hereinabove. It will be realized by those skilled in the art that the heater assembly 22 can be adapted for other insertion and removal techniques. For example, wafers can be inserted and removed by a thin vacuum chuck of the type commonly used in the semiconductor industry. The small dimension of the slot 42 can be increased slightly to accomodate the thickness of a wafer and a thin profile vacuum chuck.

In operation, the wafer 50 is heated from a temperature on the order of 30° C. to a temperature on the order of 900° C. in a number of seconds, typically, from one to ten seconds. Normally, the power input to the source 46 is ramped or increased at a constant rate until the desired temperature is reached. The thermal input to the wafer; that is, the integral of energy flux over time, depends on the wafer mass, material type, dopant concentration and processing history of the wafer. The wafer 50 is heated by a constant planar energy flux produced by the blackbody radiation source 46. The term "constant planar energy flux" means that across a planar front a constant energy flux is produced by the source 46. The power can vary due to ramping of the source, but the energy flux across the planar front remains constant. The planar isotherm uniformly heats the wafer 50. This occurs in part because blackbody radiation is primarily in the infrared portion of the spectrum and silicon is partially transparent to infrared. Thus, the radiation penetrates a several hundred micron thick wafer in milliseconds and heats it uniformly. When the surface temperature of the wafer is 900° C., the gradient through the wafer is less than 50° C. In addition, the radiation can be reflected from the shields and passed back through the wafer with additional absorption or can radiate back to the source and enhance source efficiency. As the temperature of the silicon increases, the band gap narrows and the portion of the blackbody spectrum below the band gap increases, thereby enhancing absorption. Also, in heavily doped semiconductors, the absorption is increased due to the doping and to the damage in the crystal structure. When thermal treatment is complete, the blackbody source 46 is either idled or is shut off. If the wafer is silicon, it is preferably then cooled down to 700° C., the approximate limit of incandescence (about 650° C.–700° C.) or less so that it may be removed from the annealing chamber.

The configuration of the heater assembly 22, illustrated in FIGS. 3–5 and described hereinabove, provides numerous advantages in the thermal processing of semiconductor wafers. The housing 40 substantially surrounds the high temperature region and contains the heat within. The radiation shields 60, 62 reflect radiation back to the wafer 50 and the source 46 and reduce radiation lost to the walls of the housing 40. Due to the lateral orientation of the slot 42 with respect to the planar blackbody source 46, the view factor is low and little radiation is lost through the slot 42. Since the heat loss from the assembly is low, the blackbody source 46 can operate more efficiently and the power supplied to the source 46 can be reduced. Furthermore, most of the thermal energy escaping from the assembly is removed by the heat sinks which form portions of the housing 40. Therefore, little heat reaches the walls of the chamber, and the problems associated with heating of the outer processing chamber are alleviated. Since the source 46 is substantially surrounded by the housing 40, there is no requirement that the source 46 be shielded with a shutter between processing of successive wafers. Therefore, the mechanical complexity, cost and reliability problems associated with a movable shutter are eliminated. A further advantage relates to the mechanical stability of the structure. Previous configurations have required mechanical movement of a wafer-holding platen relative to the blackbody source, thereby introducing the possibility of mechanical positioning variations. The heater assembly 22 utilizes a unitary structure with no moving parts. Thus, when a wafer 50 is inserted into the assembly 22, variations in spacing between the wafer 50 and the blackbody source 46 are minimized.

While there has been shown and described what is at present considered the preferred embodiment of the invention, it will be obvious to those skilled in the art that various changes and modifications may be made therein without departing from the scope of the invention, as defined by the appended claims.

What is claimed is:

1. Apparatus for thermal processing of a semiconductor wafer comprising:

a processing chamber;

means for controlling the pressure in said processing chamber;

wafer handling means for introducing and removing said semiconductor wafer from said processing chamber; and a heater assembly positioned in said processing chamber and adapted for rotation between a wafer-receiving position in which said wafer is received from said wafer handling means and a wafer-ejecting position in which said wafer is ejected to said wafer handling means, said heater assembly comprising:

a housing including a slot for slidably receiving and ejecting said wafer and heat sink means for removal of thermal energy, a blackbody source having a constant planar energy flux characteristic;

wafer support means in alignment with said slot for slidably receiving said wafer from said wafer handling means and including means for guiding said wafer to a processing position adjacent to but spaced apart from said source in substantially parallel planar alignment therewith, and radiation shield means positioned within said housing on opposite sides of a heater subassembly including said source and said wafer support means, said housing substantially enclosing and supporting said source, said wafer support means and said radiation shields means in fixed relative positions whereby said heater assembly prevents substantial radiation of thermal energy into said processing chamber and provides a mechanically stable relationship between said source and said wafer.

2. The apparatus as defined in claim 1 wherein said wafer support means includes lip portions for support of said wafer near its outer periphery and a stop against which the edge of said wafer rests in said wafer-processing position whereby said wafer is positioned in alignment with said blackbody source with a central area exposed thereto.

3. The apparatus as defined in claim 2 wherein said radiation shield means includes at least one thin metallic layer spaced apart from adjacent elements in substantially planar parallel alignment with said blackbody source.

4. The apparatus as defined in claim 3 wherein said blackbody source includes a planar layer of graphite cut into a serpentine pattern of connecting strips so as to provide a planar energy flux characteristic.

5. The apparatus as defined in claim 2 wherein said heat sink means includes a thermally conductive member in substantially planar parallel alignment with said blackbody source, said member having coolant tubes attached thereto for removal of heat.

6. The apparatus as defined in claim 5 wherein the pressure in said processing chamber is maintained during thermal processing by said control means such that the mean free path of gas molecules is much greater than the spacing between said source and said wafer.

* * * * *